United States Patent [19]

Sayka

[11] Patent Number: 5,310,621
[45] Date of Patent: May 10, 1994

[54] SEMICONDUCTOR PHOTOLITHOGRAPHY WITH SUPERFICIAL PLASMA ETCH

[75] Inventor: Anthony Sayka, San Antonio, Tex.

[73] Assignee: VLSI Technology, Inc., San Jose, Calif.

[21] Appl. No.: 880,470

[22] Filed: May 6, 1992

Related U.S. Application Data

[63] Continuation of Ser. No. 626,940, Dec. 13, 1990, abandoned.

[51] Int. Cl.$^5$ .................................................. G03F 7/00
[52] U.S. Cl. ..................................... 430/311; 430/322; 430/323; 430/327; 430/313
[58] Field of Search ................ 430/311, 313, 314, 320, 430/322, 323, 327

[56] References Cited

U.S. PATENT DOCUMENTS 4,176,003 11/1979 Brower et al. .................. 430/313

OTHER PUBLICATIONS

Sayka et al. "The Effect of Plasma Treatment on the Wetability of Substrate Materials" *Solid State Technology,* May 1989, pp. 69–70.
"KTI HMDS" Brochure, KTI Chemicals Inc., HMO-S-88-2500, 1988.

*Primary Examiner*—Marion E. McCamish
*Assistant Examiner*—Kathleen Duda
*Attorney, Agent, or Firm*—Clifton L. Anderson

[57] ABSTRACT

A photolithographic process involves the use of plasma to effect a superficial etch of a semiconductor wafer prior to the application of photoresist. Photoresist is applied directly on the wafer, without using an adhesion promotor. The photoresist is then exposed to patterned light. After exposure, the photoresist is developed leaving the desired photoresist mask on the wafer. Due to the superficial etch, curling of the photoresist is minimized, enhancing the selective protection provided by the photoresist to the wafer below.

16 Claims, 3 Drawing Sheets

SEMICONDUCTOR PHOTOLITHOGRAPHY WITH SUPERFICIAL PLASMA ETCH

This is a continuation of application Ser. No. 07/626,940 filed Dec. 13, 1990 now abandoned.

BACKGROUND OF THE INVENTION

The present invention relates to semiconductor processing and, more particularly, to photolithographic processing of semiconductor materials. A major objective of the present invention is to improve the precision with which integrated circuit features can be defined using photolithography.

Much of modern technological progress is identified with miniaturization of integrated circuits. Miniaturization allows for increased functionality by increasing the number of circuits that can be integrated onto a single device. Increased processing speeds are also achieved as the capacitances and distances between circuit elements are reduced. In addition, miniaturization can lower costs by increasing the number of integrated circuit devices that can be made together.

Photolithography, a pervasive component of semiconductor processing, provides for the definition of integrated circuit features using patterns of light. Typically, a semiconductor wafer, at an initial or intermediate stage of processing, is coated with photoresist. A photoresist is a material whose solubility or reactivity changes as it is exposed to light. In photolithography, the light is patterned so that some regions of the photoresist are altered while others are not. A "negative" photoresist is one for which development removes unexposed photoresist, while a "positive" photoresist is one for which development removes exposed photoresist. Commonly, a positive photoresist is used which acidifies when exposed to ultraviolet light. An alkaline developer can be used to removed the exposed photoresist. The unexposed photoresist then masks the regions it covers, while the uncovered regions are subjected to subsequent processing steps.

Increasing miniaturization, i.e., increasing circuit density, requires that circuit features be made smaller and be arranged more closely together. However, small deviations in the manufacture of small, closely-spaced features can lead to non-functioning circuits. To increase the yield of integrated circuit manufacturing, circuits are made larger and spaced further apart than theoretically necessary so that tolerance is provided for errors in device placement and definition. Greater circuit density, as well as performance and economy could be achieved if photolithography could be made more precise.

The importance of photolithographic precision can be illustrated in the context of a metal-on-oxide (MOS) transistor. A MOS transistor functions as a switch having a source, a drain, and a gate. The source and drain can be electrically coupled and decoupled by varying the voltage applied to the gate. The gate of a MOS transistor lies over a channel in the semiconductor which has a conductivity type opposite to that of the source and drain regions. Conductivity type is determined by dopants introduced into the semiconductor material. If the dopant intended for the source and drain enters the intended channel region, the transistor will not function according to design. For this reason, the channel region is typically masked during introduction of the dopant intended for the source and drain.

The mask can be defined photolithographically. A layer of silicon dioxide can be formed over the semiconductor substrate. Positive photoresist can be spun on over the silicon dioxide. The photoresist can be exposed to ultraviolet light that is patterned so as to define the channel region. The exposed photoresist is dissolved and removed, while leaving unexposed photoresist over the source and drain. The portions of the silicon dioxide thereby uncovered are then chemically etched away, defining apertures through the silicon dioxide over the intended source and drain regions. The remaining photoresist can be removed at this point. The dopant for the source and drain is then introduced into the proper semiconductor regions. However, the dopant cannot penetrate through the silicon dioxide protecting the channel region.

One limitation on photolithographic precision is a tendency of the photoresist to curl away from the underlying surface. This can subject regions under the curl to unintended treatment. In the case of the MOS transistor, the chemical etchant can seep under the hardened photoresist and remove silicon dioxide from over the channel region. This can result in source/drain dopant entering the channel region, impairing or destroying the resulting transistor. This scenario can be accommodated by providing dimensional tolerances at the expense of circuit density and performance.

To address this problem, an adhesion promotor has been applied before the photoresist to limit its curling. In MOS processing, an adhesion promoter such as hexamethyldisilazane (HMDS) can applied to an oxide layer surface of the wafer before it is coated by a photoresist. The adhesion promoter can be applied by any one of several common coating techniques. For example, a quantity of the HMDS can be coated onto the wafer and the wafer then can be spun at speeds of from 3000 to 6000 revolutions per minute (rpm) to spread the adhesive by centrifugal force. Alternatively, a desired thickness of coating can be attained either by immersing the wafer in a solution of adhesion promoter, or by depositing vaporized adhesion promoter onto the wafer. Deposition of photoresist can then proceed as usual.

However, the use of adhesion promoters has some inherent disadvantages. One disadvantage is that many adhesion promoters—including HMDS—can introduce contaminants, which can adversely effect the photoresist. Another disadvantage is that thin adhesion-promoting films on a wafer can lead to interference of the ultraviolet light used to expose the photoresist. This interference makes precise control of opening widths difficult. In addition, because some coatings can chemically react with some adhesives, the method of applying adhesives on the wafer to improve the photolithographic processing is limited in practical application. Toxicity and/or flammability of adhesives makes the use of adhesives inconvenient and hazardous, since great attention and care must be paid during movement and application.

What is needed is a photolithographic process that improves photolithographic precision without the use of adhesion promoters, and without introducing toxics, contaminants, or side reactions. This process should also be applicable to various wafer and layer compositions, and with various coating materials.

SUMMARY OF THE INVENTION

In accordance with the present invention, a photolithographic method provides for a superficial plasma etch prior to the application of photoresist. The superficial etch ensures adhesion of the photoresist without the use of an intermediate adhesive. Thereafter, patterned exposure of the photoresist and removal of soluble photoresist result in a structure suitably protected for subsequent processing steps.

In accordance with the method, a semiconductor wafer is placed in a plasma confinement chamber. A gas, preferably a noble gas such as helium or argon, is introduced into the chamber and exhausted from the chamber. Preferably, the gas flow rate is between 80 standard cubic centimeters (sccm) and 125 sccm and the pressure within the chamber is maintained between 100 mTorr and 200 mTorr. Radio frequency energy, preferably with a power between 150 watts and 200 watts, is applied to generate a radio frequency electric field. The radio frequency electric field establishes a plasma within the chamber. The noble gas ions of the plasma bombard the surface of the wafer. The wafer is thus cleaned and superficially etched.

The wafer can be a silicon or other semiconductor wafer. The surface exposed to the plasma can be crystalline substrate, epitaxially grown silicon, or polycrystalline silicon. Alternatively, the exposed surface can be a metallic layer, e.g., of aluminum or a titanium-tungsten alloy, or a dielectric layer, e.g., of silicon dioxide or silicon nitride. In any case, it is believed that the superficial etch improves photoresist adhesion by removing any foreign material which might interfere with adhesion and by providing additional bonding sites to improve adhesion.

The photoresist can then be patterned by exposure to patterned light. The absence of photoresist curling provided by the improved photoresist adhesion minimizes optical distortion of the pattern. Solvent can then be applied to removed the photoresist made or left, depending on whether a negative or positive photoresist is used, soluble by exposure to light. Since the remaining photoresist is securely bonded to the surface below, subsequent processing can take place without seepage of chemical etches, reactant gases, dopants, etc., over photoresist-protected areas of the wafer.

The present invention provides for improved photolithography. Minimizing of optical distortion permits smaller features to be defined, yielding denser and faster integrated circuits. Improved protection by patterned photoresist also furthers these objectives. Unlike methods employing an adhesion promoter to bind photoresist, the present invention does not introduce adhesive handling problems or expose the wafer to unwanted contaminants. In fact, the plasma removes foreign material whicn could otherwise deteriorate device performance. Thus, the present invention enhances device reliability. These and other features and advantages of the present invention are apparent from the description below with reference to the following drawings.

BRIEF DESCRIPTION OF THE DRAWING

FIG. 3A is a schematic depiction of a silicon wafer before superficial etching. FIG. 3B shows ions superficially etching the wafer, and FIG. 3C shows the wafer surface after superficial etching.

DESCRIPTION OF THE PREFERRED EMBODIMENT

Figure 1:
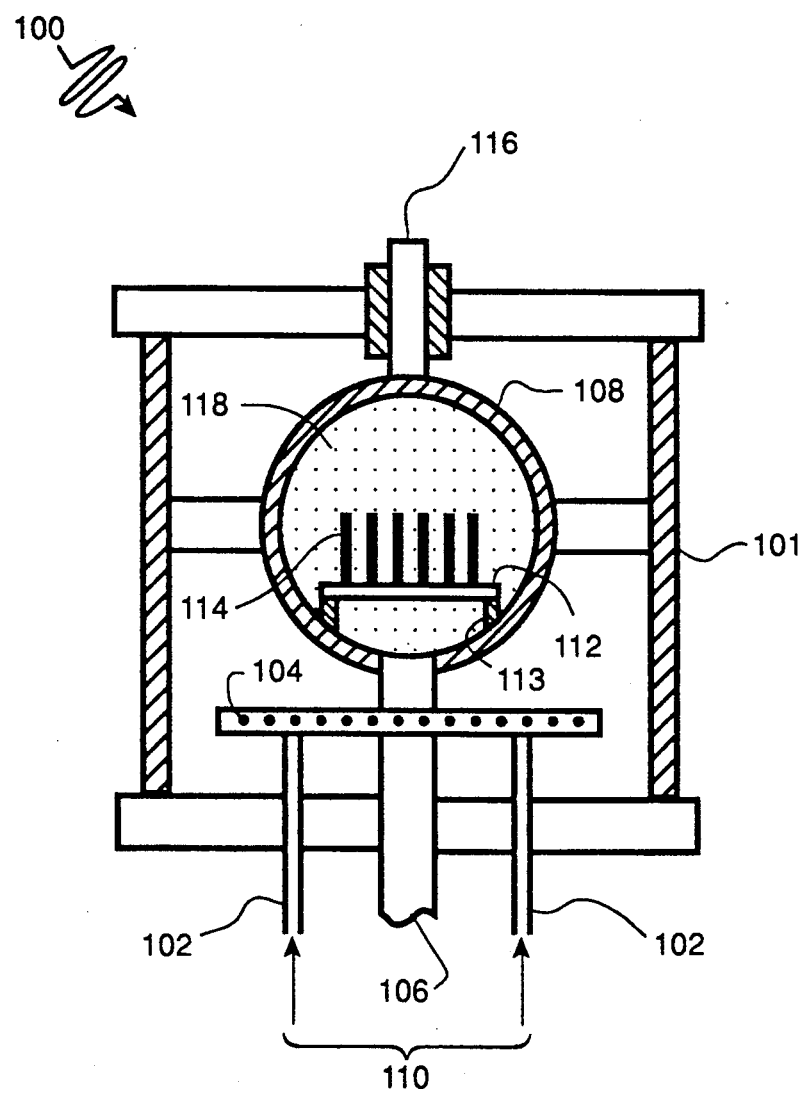
FIG. 1 is a schematic cross-sectional view of a vacuum system for implementing photolithographic processing in accordance with the present invention.

The present invention is practiced in the context of a vacuum system 100, shown in FIG. 1, for the photolithographic processing of semiconductor wafers. Vacuum system 100 comprises a vacuum chamber 101, inlets 102 for injecting noble gas 110, a gas ring 104 engaged to inlets 102, an outlet 106 for exhausting depleted ion gas, a barrel-type electrode 108, a reverse electrode 112 on which semiconductor wafers 114 are held and an insulator 113 for insulating barrel-type electrode 108 from reverse electrode 112. Conductor 116 conducts radio frequency energy to barrel-type electrode 108 and reverse electrode 112 so as to generate a radio frequency electrical field and excite the gas 110 inside barrel-type electrode 108 to an ionized form 118 of gas 110.

In accordance with a method of the invention, semiconductor wafers 114 are placed on reverse electrode 112 insulated from barrel-type electrode 108, and noble gas 110, preferable argon or helium gas, is injected into vacuum system 100, via inlets 102 and gas ring 104, at a flow rate of between 80 sccm and 125 sccm, and preferably at about 100 sccm, until vacuum chamber 101 is filled with the reactant gas 110 at a pressure of between 100 milliTorr (mTorr) and 200 mTorr, and preferably at about 150 mTorr. Radio frequency energy is applied to barrel-type electrode 108 via conductor 116 so as to generate a radio frequency electrical field in barrel-type electrode 108. The radio frequency energy is introduced at a rate between 150 watts and 250 watts, and preferably at about 200 watts. The electrical field excites the gas 110 into an ionized form 118, such as argon plasma gas.

Figure 2:
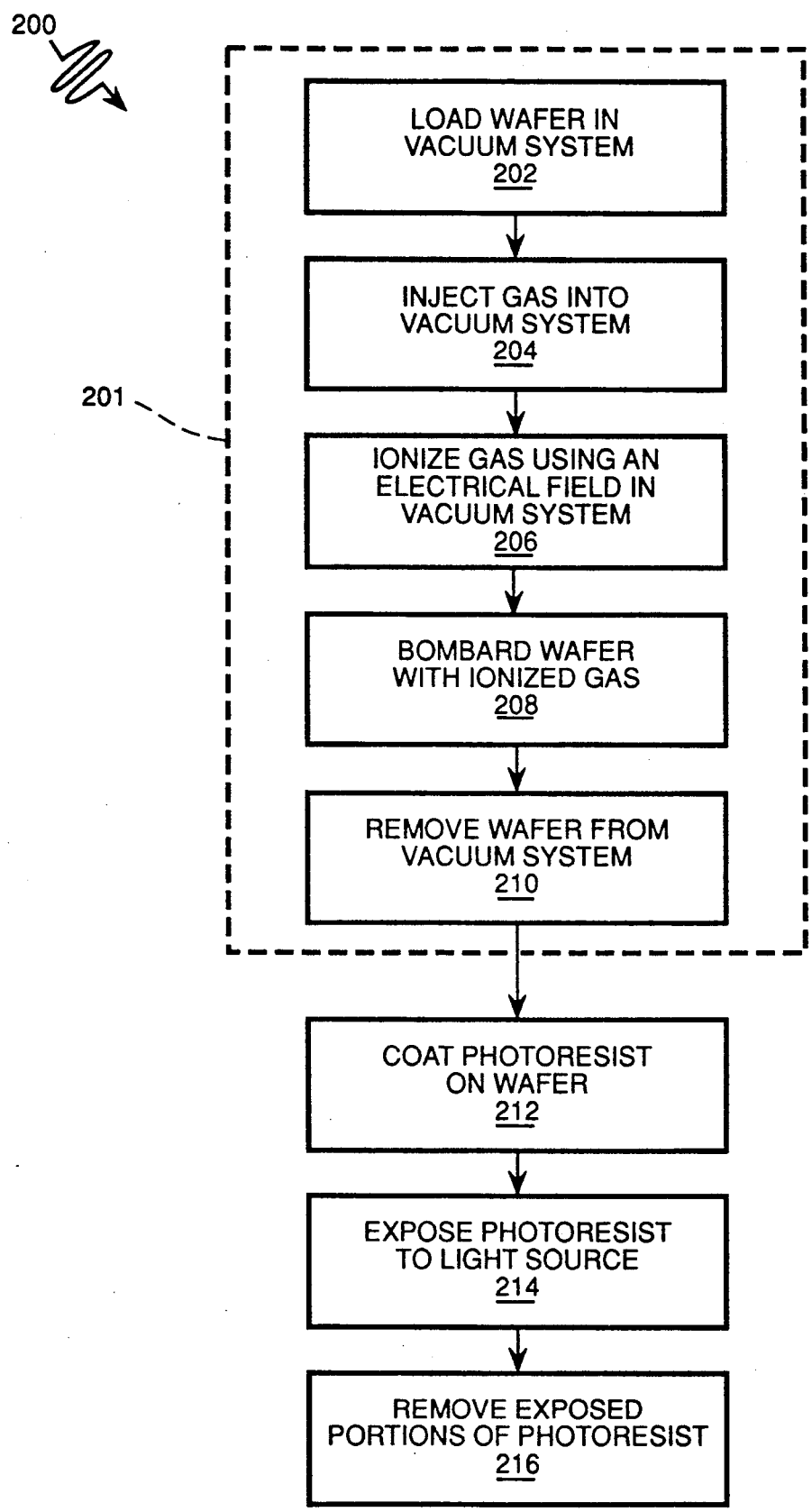
FIG. 2 is a flow chart of the photolithographic method of the present invention.

The photolithographic processing 200 of the present invention, in accordance with the present invention, comprises processing procedures 201 and 212-216, as shown in FIG. 2. Procedure 201 is for superficially etching the surfaces of semiconductor wafers 114 prior to coating the wafers with a photoresist.

Because it contains positively and negatively charged mobile particles that interact under the effect of Coulomb forces, the plasma is far from equilibrium, and therefore exhibits microscopic, or particle, instabilities and macroscopic, or hydromagnetic, instabilities. Because of the repulsion of like-charged ions, charged particles of ion gas 118 bombard the surfaces of wafers 114 held on reverse electrode 112 insulated from barrel-type electrode 108. This superficially etches the wafers. Etching proceeds long enough to ensure cleaning and superficial etching without deleteriously damaging the exposed surface. The illustrated method applies the plasma for a period between 45 and 90 seconds, preferably about 60 seconds. After the radio frequency energy is terminated and the spent gases exhausted from the chamber, wafers 114 are removed from vacuum chamber 101, at step 210.

Conditions are established to ignite and maintain a plasma within chamber 101. Fresh gas is introduced and spent gas is exhausted at a rate between about 80 sccm and 125 sccm so as to establish a pressure between 100 mTorr and 200 mTorr within chamber 101. Preferably, the flow rate is about 100 sccm and the pressure is about 150 mTorr. The electric power used to establish the plasma is between about 150 Watts and 250 Watts, and preferably about 200 Watts.

After completion of procedure 201, a positive photoresist is spun on the surfaces of wafers 114, at step 212. Coated wafers are placed under an ultraviolet light source for exposure through a pattern mask, at step 214. The photoresist is then developed, at step 216; specifically, alkaline developer is used to remove the portions of the photoresist acidified by exposure to ultraviolet light. The wafer now has a protective patterned mask of photoresist in place for subsequent processing.

Figure 3A:
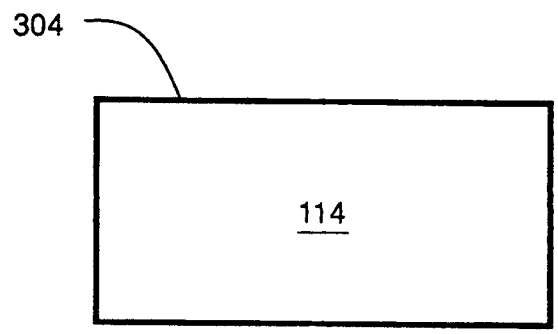
FIGS. 3A-3C illustrate selected steps of the method of FIG. 2.
Figure 3B:
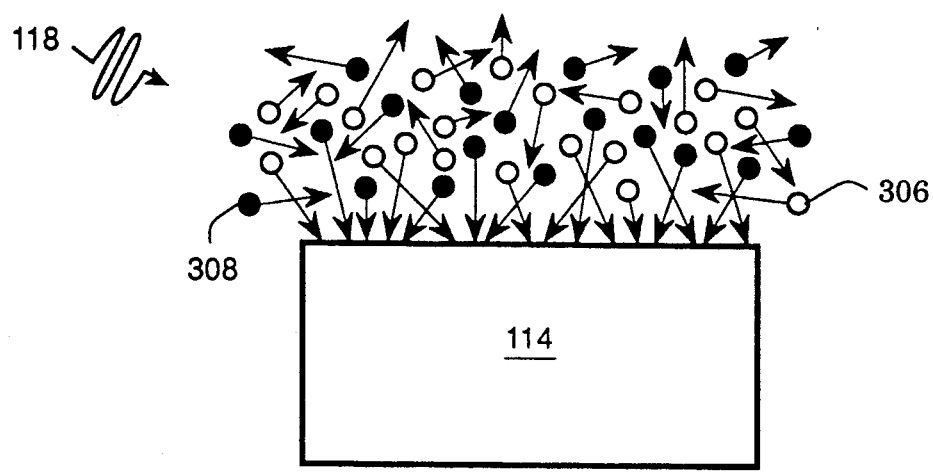
Figure 3C:
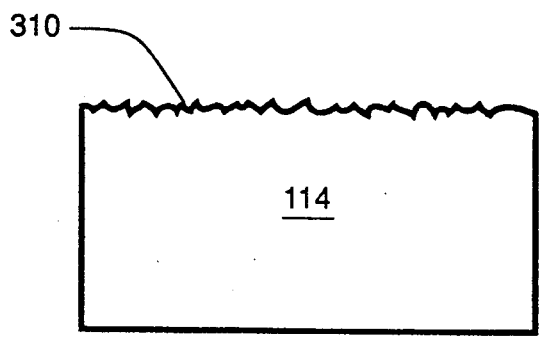

The process of superficial etching of a silicon wafer is shown in FIG. 3. As depicted in FIG. 3A, silicon wafer 114 initially has an unetched surface 304, to which photoresist will not adhere securely without an adhesion promoter. Wafer 114 is then exposed to ionized gas 118, which is composed of positive ions 306 and electrons 308. Because of the mutual repulsion of positive ions 306 and 308 under Coulomb forces, the ions strike the surface of wafer 114 with sufficient force to etch the surface 304 of wafer, as shown in FIG. 3B. This ion bombardment, as shown in FIG. 3B, produces a rough, etched surface 310, as shown in FIG. 3C. When etched surface 310 is achieved, the wafer is removed from vacuum chamber 101, and photoresist is applied directly to rough surface 310 of wafer 114.

To compare the effect of prior art with that of the photolithographic processing of the present invention, an experiment comparing three groups of silicon wafers was conducted. The first group was processed using a conventional HMDS adhesive primer before photoresist was applied to the silicon wafers. The second group of silicon wafers was processed with argon plasma gas before photoresist was applied directly to the wafer surface, in accordance with the present invention. In the third group, photoresist was applied directly to bare wafers.

Photoresist applied directly to etched wafers adhered as well as photoresist applied to unetched, adhesive-coated wafers. No significant curling of photoresist occurred in either the etched uncoated wafers or the unetched, adhesive-coated wafers. Without the plasma etching treatment, however, when photoresist was applied directly to wafers, significant curling occurred, especially on the smaller geometries. Further tests show that the adhesion effect promoted by argon plasma gas used in accordance with the present invention can last for at least seven hours prior to coating the wafers.

In accordance with the present invention, suitable vacuum systems include those systems capable of sustaining an ionized gas, such as argon plasma gas, under the preferred conditions. Wafers can be processed either in batches or on a one by one basis, at the user's selection and depending on the vacuum system used. Other ionized gases can be used to etch wafers by bombardment, including helium plasma gas. Processing with such other gases appears to be most effective using operating parameters similar to those used with argon plasma gas.

Semiconductor wafers capable of being processed by such ionized gases further include aluminum wafers and wafers with surface layers of titanium tungsten (TiW), silicon dioxide, and/or silicon nitride. These and other modifications to and variations upon the preferred embodiments are provided for by the present invention, the scope of which is limited only by the following claims.

What is claimed is:

1. A method for photolithographic processing of semiconductors, said method comprising the steps of:
   placing a wafer having a surface into a plasma confinement chamber;
   introducing a noble gas into said confinement chamber;
   ionizing said noble gas using a radio frequency electric field in said confinement chamber to create a noble-gas plasma so that a superficial etch of said wafer is performed;
   removing said wafer from said confinement chamber;
   applying a photoresist directly to said surface of said wafer;
   exposing a selected portion of said photoresist to patterned light so as to create definite soluble and insoluble portions of said photoresist; and
   applying solvent to remove said soluble portions of said photoresist.

2. A method as recited in claim 1 wherein said surface is silicon.

3. A method as recited in claim 1 wherein said surface is metallic.

4. A method as recited in claim 1 wherein said surface is silicon dioxide.

5. A method as recited in claim 1 wherein said surface is silicon nitride.

6. A method as recited in claim 1 wherein said radio frequency energy is characterized by a power between 150 watts and 250 watts.

7. A method as recited in claim 1 wherein said ionizing step is continued for between 45 seconds and 90 seconds.

8. A method as recited in claim 1 wherein said noble gas passes through said vacuum chamber at a rate between 80 sccm and 125 sccm.

9. A method as recited in claim 1 wherein said vacuum chamber is under a pressure between 100 mTorr and 200 mTorr.

10. A method as recited in claim 1 wherein said radio frequency energy is characterized by a power between 150 watts and 250 watts and wherein the pressure within said vacuum chamber is between 100 mTorr and 200 mTorr.

11. A method for photolithographic processing of semiconductors, said method comprising the steps of:
    placing a semiconductor wafer having a wafer surface into said vacuum chamber;
    introducing a noble gas into and exhausting said noble gas from said vacuum chamber at a rate between 80 sccm and 125 sccm so as to maintain a pressure between about 100 mTorr and 200 mTorr;
    ionizing said noble gas in said vacuum chamber by applying radio frequency energy between about 150 and 250 watts to generate a radio frequency electric field so that said wafer is superficially etched for a period of about 45 to 90 seconds;
    removing said wafer from said vacuum chamber;
    applying a photoresist directly to said wafer surface;
    exposing a selected portion of said photoresist to patterned radiation so as to create definite soluble and insoluble portions of said photoresist; and
    applying solvent to remove said soluble portions of said photoresist.

12. A method as recited in claim 11 wherein said noble gas is argon gas.

13. A method as recited in claim 11 said noble gas is at a pressure of about 150 mTorr.

14. A method as recited in claim 11 wherein said noble gas passes through said vacuum chamber at a rate of about 100 sccm.

15. A method as recited in claim 11 wherein said radio frequency energy for generating said electrical field in said vacuum chamber is about 200 watts.

16. A method as recited in claim 11 wherein said ionizing step is continued for a period of time of about 60 seconds.

* * * * *